(12) United States Patent
Hughes et al.

(10) Patent No.: US 8,892,923 B2
(45) Date of Patent: Nov. 18, 2014

(54) DATA PROCESSING APPARATUS AND METHOD FOR MAINTAINING A TIME COUNT VALUE IN NORMAL AND POWER SAVING MODES OF OPERATION

(75) Inventors: Paul Stanley Hughes, Cambridge (GB); Jason Parker, Sheffield (GB)

(73) Assignee: ARM Limited, Cambridge (GB)

( * ) Notice: Subject to any disclaimer, the term of this patent is extended or adjusted under 35 U.S.C. 154(b) by 420 days.

(21) Appl. No.: 13/331,320

(22) Filed: Dec. 20, 2011

(65) Prior Publication Data

US 2013/0159747 A1  Jun. 20, 2013

(51) Int. Cl.
*G06F 1/00* (2006.01)
*G06F 1/32* (2006.01)

(52) U.S. Cl.
CPC .................................... *G06F 1/3237* (2013.01)
USPC ......................................................... 713/322

(58) Field of Classification Search
CPC .................................................. G06F 1/3237
USPC ................................................. 713/300, 400
See application file for complete search history.

(56) References Cited

U.S. PATENT DOCUMENTS

| 6,453,181 | B1 * | 9/2002 | Challa et al. ................... 455/574 |
| 7,437,578 | B2 * | 10/2008 | Menzl ........................... 713/300 |
| 7,571,335 | B2 * | 8/2009 | Lee ............................... 713/330 |
| 8,321,717 | B2 * | 11/2012 | Harrison et al. ............... 713/500 |
| 2006/0069816 | A1 * | 3/2006 | Oshikawa et al. .............. 710/14 |
| 2007/0105525 | A1 * | 5/2007 | Wang et al. ................. 455/343.1 |

\* cited by examiner

*Primary Examiner* — Mohammed Rehman
(74) *Attorney, Agent, or Firm* — Nixon & Vanderhye P.C.

(57) ABSTRACT

A counting circuit for a data processing apparatus has a normal mode in which a main counter increments the time count value in response to edges of a main clock signal, and a power saving mode in which the main clock signal is disabled and a further clock counter counts elapsed edges of a further clock signal having a lower frequency than the main clock signal. On switching to power saving mode, a reference time count value of the main counter is captured at a timing triggered by an edge of the further clock signal. On switching back to normal mode, an expected time count value from the main counter is calculated based on the captured reference value and the counted number of elapsed edges during the power saving mode, and the main counter is restarted at a timing triggered by another edge of the further clock signal.

22 Claims, 8 Drawing Sheets

DATA PROCESSING APPARATUS AND METHOD FOR MAINTAINING A TIME COUNT VALUE IN NORMAL AND POWER SAVING MODES OF OPERATION

BACKGROUND OF THE INVENTION

1. Field of the Invention

The present invention relates to a data processing apparatus and method. In particular, the invention relates to a data processing apparatus and method for maintaining a time count value.

2. Background to the Invention

A data processing apparatus may include a counter for counting a time count value indicating the passage of time, to allow events to be triggered when the counter reaches a given value. For example, in a multi-threading environment, a timer can be set up for triggering a processor to switch between processing one thread and processing another thread when the counter reaches a particular time count value. In another example, an alarm may be set to sound when the time counter reaches a preset value.

Time counters may be provided with multiple modes of operation in which the time counter is updated at different frequencies. This allows a trade off between improved counter precision (using a higher frequency mode) and reduced power consumption (using a lower frequency mode). To ensure that events timed to the counter are triggered at the correct timing, on returning to the higher frequency mode after a period in the lower frequency mode the counter value should be the same as if the counter had been operating in the higher frequency mode all along. To ensure that this requirement is satisfied, the frequency modes have been limited to modes in which the clock signals that clock the counter in each mode are synchronised with one another and have integer ratio frequencies. However, this limits the choice in which frequency modes can be provided.

SUMMARY OF THE INVENTION

Viewed from one aspect, the present invention provides a data processing apparatus comprising:

a counting circuit for maintaining a time count value for said data processing apparatus, said counting circuit comprising a main counter and a further counter; and a counter controller configured to control said counting circuit; wherein:

said counting circuit has a plurality of modes of operation including:

(i) a normal mode of operation in which said main counter is configured to increment said time count value in response to clock edges of a main clock signal; and (ii) a power saving mode of operation in which said main clock signal is disabled, and said further counter is configured to count a number of elapsed clock edges of a further clock signal having a lower frequency than said main clock signal; wherein:

on switching from said normal mode to said power saving mode, at least one of said counting circuit and said counter controller is configured to store, as a reference time count value, a current value of said time count value at a timing triggered by a first edge of said further clock signal; and on switching from said power saving mode to said normal mode, said counter controller is configured to set said time count value of said main counter to an expected time count value calculated based on said reference time count value and the number of elapsed clock edges of said further clock signal counted by said further counter since said timing triggered by said first edge, and to control said main counter to restart incrementing of said time count value from said expected time count value at a timing triggered by another edge of said further clock signal.

The present technique provides a counting circuit for maintaining a time count value for a data processing apparatus. The counting circuit has a normal mode and a power saving mode of operation. In the normal mode, a main counter increments the time count value in response to clock edges of a main clock signal. The time count value represents the passing of time and can be used by other elements of the processing apparatus to trigger events or tasks to be performed.

In the power saving mode of operation, the main clock signal is disabled to reduce power consumption, while a further counter counts a number of elapsed clock edges of a further clock signal having a lower frequency than the main clock signal. As the further clock signal has lower frequency than the main clock signal, the further counter enables time to be counted during the power saving mode while consuming less power than in the normal mode.

By capturing the current value of the time count value as a reference time count value on entering power saving mode, during the power saving mode using the further counter to count elapsed edges of the further clock signal and on returning to the normal mode setting the main count value to an expected time count value calculated based on the reference time count value and the counted number of elapsed further clock edges, the main counter value can be restored to the time count value which the main counter would be expected to have if the counter had continued in the normal mode.

Also, by using edges of the further clock signal to trigger the capture of the reference time count value on entry to power saving mode and the restarting of incrementing of the time count value following exit from the power saving mode, the accuracy of the calculated expected time count value can be improved, since the edges of the further clock signal are the points at which the relation between the further clock signal and the main clock signal can be determined most accurately. That is, the time period measured by the further clock signal while the main counter is disabled comprises a whole number of further clock cycles, and so the time at which the main counter is restarted can be calculated accurately.

Hence, the present technique allows the main time counter value to be restored following exit from the power saving mode even in the case where the main clock signal and further clock signal have frequencies with non-integer ratios and/or are not synchronised to one another.

In the present specification, if an event is described as occurring "on switching" from the normal mode to the power saving mode, or "on switching" from the power saving mode to the normal mode, then the event occurs at some point during the switching process. The term "on switching" need not imply that the event occurs at the exact moment of which the main clock signal is disabled or enabled.

The counter controller for controlling the counter circuit may be implemented in various ways. In one example, the counting circuit itself comprises the counter controller. In this case, the counter controller could be a dedicated processing element located separately from other processing circuits of the data processing apparatus.

Alternatively, the data processing apparatus may comprise a processing circuit for performing data processing, and the processing circuit may act as the counter controller.

As described above, the further counter counts clock edges of the further clock signal during the power saving mode. It is possible that the further counter may be halted when the counter circuit is in the normal mode, as in the normal mode the main counter is active and so there is no need to count further clock edges. In this case, the further counter may be set to zero during the normal mode and restarted when the circuit switches to the power saving mode. When the expected time count value for the main counter is calculated then the counter controller may read the further count value to determine the elapsed number of clock edges of the further clock signal.

However, it may be more convenient for the further counter to increment the further count value in response to clock edges of the further clock signal during both the normal mode and the power saving mode. This may be more efficient since this means there is no need to control the timing at which the further counter starts and stops counting the clock edges of the further clock signal.

In embodiments in which the further counter continues to count edges of the further clock signal during both the normal mode and the power saving mode then on switching from the normal mode to the power saving mode the counter controller may store, as a reference further time count value, a current value of the further count value at the timing triggered by the first edge, and on switching from the power saving mode to the normal mode, the counter controller may determine the number of elapsed clock edges of the further clock signal since the timing triggered by the first edge of the further clock signal as a difference between the reference further count value and the current further count value.

The stored reference time count value and reference further time count value may be stored in various locations. For example, the values may be stored within the counter circuit itself or may be transferred by the counter controller to another part of the data processing apparatus for storage. A register or a memory may be used to store the values. The storage may be on-chip or off-chip.

The further count value of the further counter may be readable by the counter controller under control of the main clock signal. By reading the further counter under control of the main clock signal which is faster than the further clock signal which is clocking the further counter, the value of the further counter from one further clock edge can be read and processed in time for the next further clock edge.

As the main and further clock signals may be asynchronous, then the timing at which the further counter is read according to the main clock signal can vary relative to the timing at which the count value is incremented according to the further clock signal. On some occasions, the main clock signal could trigger the further counter to be read as the count value is being incremented according to the further clock signal. If the further count value was encoded using a standard binary representation, then an increment between successive count values may require multiple bits of the count value to switch states, and so if the counter is read just as the count value is being incremented, it is possible for only some of the bits to have completed the transition at the time at which the count value is read. This could lead to the further count value being read with an intermediate count value which is neither the original value of the counter before the update nor the correct value of the counter after the update. This could cause problems in which time could be perceived to be running backwards. For example, in a switch from a count value of 5 (0b101) to a new value of 6 (0b110), if the middle bit has not yet switched at the time the value is read, but the least significant bit has switched, this could lead to the counter being read with a value of 4 (0b100), which would seem to indicate that time has gone backwards.

To avoid this problem, the further count value of the further counter may be Gray encoded. In the Gray encoding, consecutive values differ only by the value of a single bit. This means that whenever the count value is incremented only one bit will switch states, and so irrespective of the timing at which the count value is read, the further count value can only be read as either the initial value of the counter or the incremented value of the counter. It is not possible for an intermediate value to be read. Using the example discussed above, the values of 5 and 6 would be Gray encoded as 0b111 and 0b101 respectively. As only the middle bit switches states during the transition, the only possible values which can be read during this transition are 5 (0b111), if the middle bit has not yet switched states at the time it is read, or 6 (0b101), if the middle bit has already switched states. Hence, it is not possible for time to be perceived as running backwards.

It is not necessary for the main count value to be Gray encoded because the main count value is both updated and read under control of the main clock signal and so the reading of the counter is synchronised with the incrementing of the counter. However, it will be appreciated that if desired the main count value could also be Gray encoded.

The counter controller may be configured to calculate the expected time count value $T_E$ according to the equation $$T_E = \left(\left(\frac{f_1}{f_2}\right)(n+p)\right) + T_{REF},$$

wherein:

$f_1$ represents a frequency of the main clock signal;
$f_2$ represents a frequency of the further clock signal;
n represents the number of elapsed clock edges of the further clock signal counted by the further counter since the timing triggered by the first edge of the further clock signal;
$T_{REF}$ represents the reference time count value; and
p represents a predicted number of further clock edges of the further clock signal which are predicted to elapse between the last of the counted number of elapsed clock edges and the main counter restarting incrementing of the time count value.

The expected time count value $T_E$ is the value which the main counter would have been expected to have reached had the main counter continued in the normal mode and not switched to the power saving mode. The expected time count value can be calculated using the equation shown above based on the ratio between the frequencies of the main clock signal and the further clock signal, the counted number of elapsed clock edges counted by the further counter since the timing at which the reference time count value was captured, the reference time count value itself, and a prediction parameter p. The prediction parameter p reflects the fact that, at the point at which the expected time count value is calculated, there may still be some time before the main counter is actually restarted. Hence, the prediction parameter p represents the number of further clock edges of the further clock signal which are predicted to have elapsed between the last of the counted number of elapsed clock edges taken into account for the calculation and the edge at which the main counter restarts incrementing of the time count value.

The prediction parameter p may take on different values for different systems. However, in many cases it may be appropriate for the prediction parameter p to equal one. In this case, when the counting circuit is to switch from the normal mode to the power saving mode, the expected time count value can be calculated at one edge of the further clock signal based on the current further count value at that time, and the counting of the main count value can restart at the next further clock edge, with the calculation taking into account the one clock edge margin between calculating the expected value and restarting the main counter.

The main counter may have an enable flag to control whether the main counter increments the time count value. For example, if the enable flag has a first state then the main counter may increment the time count value, and if the enable flag has a second state then the main counter may not increment the time count value. During the power saving mode, the enable flag may be set to the second state. On switching from the power saving mode to the normal mode, the enable flag may be switched to the first state to restart the main counter incrementing the time count value.

To ensure that the main counter restarts incrementing the time count value in response to an edge of the further clock signal, during the power saving mode the enable flag may be updateable only in response to an edge of the further clock signal. By preventing updates to the enable flag during the power saving mode other than in response to an edge of the further clock signal, it is ensured that the restarting of counting is timed to a further clock edge, which is the time point for which the expected time count value can be determined most accurately.

Different mechanisms may be used to ensure that the enable flag is updated only in response to an edge of the further clock signal. In one example, the counter controller may control updates to the enable flag to ensure that the flag is updatable only in response to an edge of the further clock signal. For example, a state machine may be used by the counter controller for this purpose. Alternatively, hardware in the counting circuit may intercept requests to update the enable flag and prevent the requests from taking effect until the next edge of the further clock signal while the counter circuit is in the power saving mode.

The enable flag may also be used during the normal mode by the counter controller or another circuit to halt incrementing of the main count value independently of switching to the power saving mode. For example, when the data processing apparatus is debugged, it may be desirable to pause incrementing of the time count value and to restart incrementing when debug is complete.

In one embodiment, the counting circuit may comprise a storage element which captures a current value of the time count value of the main counter in response to each clock edge of the further clock signal. This allows the time count value at the last clock edge of the further clock signal to be retained as the main counter continues to increment the time count value, so that if the circuit is switched to the power saving mode, the captured value at the most recent further clock edge can be read and saved as the reference time count value (the captured value may be read either on entry to the power saving mode or at some later time before the expected time count value is calculated). As the main counter value at the most recent further clock edge is captured, and not the current main counter value at the time of switching, this allows the expected time count value to be calculated more accurately, since the relationship between cycles of the main clock signal and the further clock signal can be determined most accurately at the clock edges of the further clock signal.

The first edge of the further clock signal which triggers the timing at which the reference value is captured, and the other edge of the further clock signal which triggers restarting of incrementing of the main counter, may comprise any two edges of the further clock signal. However, in one embodiment the first edge is the most recent edge of the further clock signal before switching to the power saving mode, and the other edge of the further clock signal is the next edge of the further clock signal after setting the time count value to the expected time count value.

The timing control of the events performed on entry and exit of the power saving mode may be controlled in different ways. In one embodiment, hardware within the counting circuit may control the timing in response to the further clock signal. Hence, the hardware may time the capture of the reference time count value and the restarting of incrementing of the main counter to edges of the further clock signal.

In another embodiment, where the counter controller comprises a processing circuit of the processing apparatus, the timing control may be based on interrupts generated by the processing circuit in response to edges of the further clock signal. In this case, on switching from the normal mode to the power saving mode, the processing circuit may generate an interrupt in response to the first edge of the further clock signal and capture the reference clock signal value in response to the interrupt. On switching from the power saving mode to the normal mode, the processing circuit may generate another interrupt in response to the other edge of the further clock signal and, in response to the interrupt, set the time count value to the expected time count value and control the main counter to restart counting of the time count value.

In this embodiment, the timings triggered by the first edge and the other edge of the further clock signal, at which the reference time count value is captured and the incrementing of the main counter is restarted, will occur slightly after the occurrence of the first edge and the other edge of the further clock signal, because of the delay in the processing circuit generating and servicing the interrupts triggered by the first edge and other edge. As the time taken for the processing circuit to generate and service an interrupt may be reasonably deterministic, such that the interrupt generated when entering the power saving mode is serviced in roughly the same time as the interrupt generated when exiting the power saving mode, then this embodiment can provide an accurate calculation of the expected time count value.

The main clock signal and further clock signal may be generated on-chip or off-chip. Hence in one embodiment, the clock signals may be generated by an external clock generator. In another embodiment, the data processing apparatus may comprise a clock generator configured to generate the main clock signal and further clock signal and a power controller configured to disable generation of the main clock signal by the clock generator during the power saving mode.

The main clock signal and further clock signal may have any clock frequencies, as long as the main clock signal has a higher frequency than the further clock signal. However, it can be particularly useful to provide the further clock signal at a frequency of 32 kHz, because a crystal oscillator for generating a 32 kHz clock signal is relatively inexpensive and is often already present in a processing apparatus. The main clock signal may have a frequency of around 10 to 100 MHz, for example.

In one embodiment, the counters may be configured to count only rising edges or only falling edges of the main or further clock signals. In this case, the counter would be incremented once per clock cycle rather than at each edge. In such an embodiment, the clock edges mentioned above comprise either only rising edges or only falling edges of the clock signals.

Alternatively, the main and further counters may count every edge of the main clock signal or further clock signal, such that the clock edges mentioned above comprise both rising edges and falling edges of the clock signals. In such an embodiment, the counter would be incremented twice per clock cycle, once at a rising edge and once at a falling edge.

Viewed from another aspect, the present invention provides a data processing apparatus comprising:

counting means for maintaining a time count value for said data processing apparatus; and counter controlling means for controlling said counting means; wherein:

said counting means has a plurality of modes of operation including a normal mode of operation and a power saving mode of operation, said counting means comprising:

(i) main counting means for, in said normal mode, incrementing said time count value in response to clock edges of a main clock signal; and (ii) further counting means for, in said power saving mode in which said main clock signal is disabled, counting a number of elapsed clock edges of a further clock signal having a lower frequency than said main clock signal; wherein:

on switching from said normal mode to said power saving mode, at least one of said counting means and said counter controlling means is configured to store, as a reference time count value, a current value of said time count value at a timing triggered by a first edge of said further clock signal; and on switching from said power saving mode to said normal mode, said counter controlling means is configured to set said time count value of said main counting means to an expected time count value calculated based on said reference time count value and the number of elapsed clock edges of said further clock signal counted by said further counting means since said timing triggered by said first edge, and to control said main counting means to restart incrementing of said time count value from said expected time count value at a timing triggered by another edge of said further clock signal.

Viewed from another aspect, the present invention provides a method of maintaining a time count value for a data processing apparatus, comprising steps of:

in a normal mode of operation, incrementing said time count value in response to clock edges of a main clock signal;

on switching from said normal mode to a power saving mode of operation, storing, as a reference time count value, a current value of said time count value at a timing triggered by a first edge of a further clock signal having a lower clock frequency than said main clock signal;

in said power saving mode, disabling said main clock signal and counting a number of elapsed edges of said further clock signal; and on switching from said power saving mode to said normal mode, setting said time count value to an expected time count value calculated based on said reference time count value and the number of elapsed edges of said further clock signal counted since said timing triggered by said first edge, and restarting incrementing of said time count value from said expected time count value at a timing triggered by another edge of said further clock signal.

Further particular and preferred aspects of the present invention are set out in the accompanying independent and dependent claims. Features of the dependent claims may be combined with features of the independent claims as appropriate, and in combinations other than those explicitly set out in the claims.

The above, and other objects, features and advantages of this invention will be apparent from the following detailed description of illustrative embodiments which is to be read in connection with the accompanying drawings.

DESCRIPTION OF EMBODIMENTS

Figure 1:
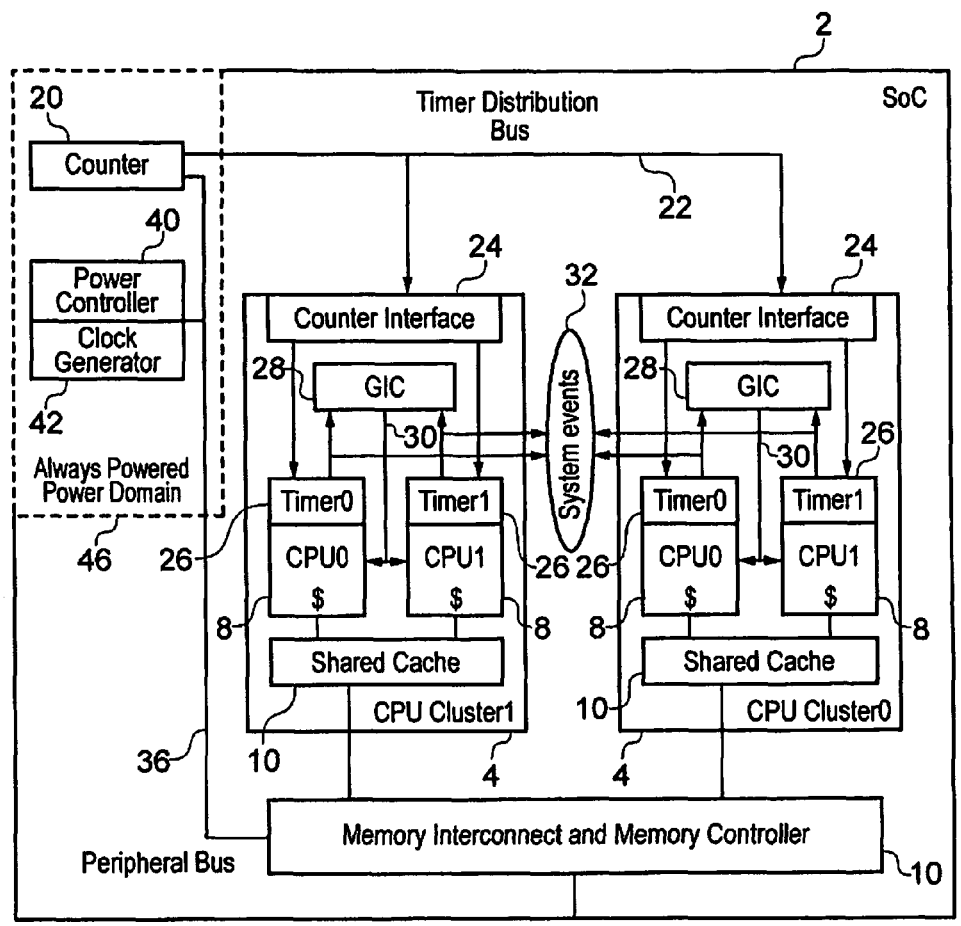
FIG. 1 schematically illustrates a data processing apparatus comprising a counting circuit.

FIG. 1 illustrates a data processing apparatus comprising a system-on-chip 2 having two CPU clusters 4. Each cluster 4 comprises at least one processor 8 for processing data. Each cluster has a shared cache 10 for storing data on behalf of the processors 8 in the cluster. The processor clusters 4 are coupled to a memory interconnect and memory controller 10 for handling accesses to memory. In the example of FIG. 1, the memory is an off-chip memory provided separately from the system-on-chip 2, but in another embodiment the memory may be on-chip. While FIG. 1 shows an example where the CPUs 8 are clustered, in other embodiments the CPUs may be unclustered, and there may be fewer CPUs or only one CPU 8.

A counting circuit 20 is provided for maintaining a time count value for the system-on-chip 2. The counting circuit 20 increments the time count value as time elapses and distributes the time count value to the processor clusters 4 via a timer distribution bus 22. The processor clusters 4 each comprise a counter interface 24 for receiving the count value and distributing the counter value within the clusters 4. Each processor 8 may set up at least one timer 26 for triggering an event when the time count value supplied by the counting circuit 20 reaches a particular value. When the timer value is reached, then the timer 26 signals to an interrupt controller 28 that the timer has expired. In response, the interrupt controller generates an interrupt signal 30 which triggers at least one of the processors 8 to perform an operation corresponding to the interrupt. For example, the timers 26 may trigger a context switch or an alarm event. The timer 26 may also trigger system events 32.

The time count value of the counting circuit 20 may be read by the processing clusters 4 via the memory interconnect 10. Hence, the counter 20 and any control values associated with the counter may be memory-mapped such that they can be accessed by a processor 8 by issuing a memory access request to the memory interconnect 10 in the same way as if the count value or control values were stored in memory. A peripheral bus 36 coupling the memory interconnect 10 to the counter value 20 enables such memory-mapped accesses.

The apparatus 2 comprises a power controller 40 for controlling a power supply to elements of the system-on-chip. Circuit elements can be placed in a power saving state by reducing the power supply to the circuit element. The counter circuit 20, power controller 40 and a clock generator 42 for generating clock signals remain in an always powered power domain 46 to allow the counting circuit 20 to keep counting the elapse of time while the rest of the circuit is in a power saving state. While FIG. 1 illustrates the power controller 40 and clock generator 42 being located on-chip, in another embodiment, the power controller 40 and clock generator 42 may be off-chip so as to be external to the system on chip 2.

The counting circuit 20 has at least two operating modes. In a normal operating mode, the counting circuit increments the time count value in response to a main clock signal supplied by the clock generator 42. The normal mode would usually be used while the remainder of the circuit 2 is active.

The counting circuit 20 also has a power saving mode in which generation of the main clock signal is disabled by the clock generator 42. During the power saving mode, the remainder of the system-on-chip 2 would usually be in a power saving state in which the higher precision of the count value maintained during the normal mode is not required. To enable the counting circuit 20 to restart counting at the correct time count value once the main clock signal is reactivated, the counting circuit 20 counts elapsed edges of a further clock signal supplied by the clock generator 42 while the counting circuit 20 is in the power saving mode. The further clock signal has a lower frequency than the main clock signal, and so counting edges of the further clock signal consumes less power than counting edges of the main clock signal.

Although embodiments discussed in the present specification will be described as having one power saving mode, it will be appreciated that the counting circuit may in some embodiments have multiple power saving modes for incrementing the count value of the counting circuit 20 at different clock frequencies. The techniques described herein can be applied to each of those multiple power saving modes.

Figure 2:
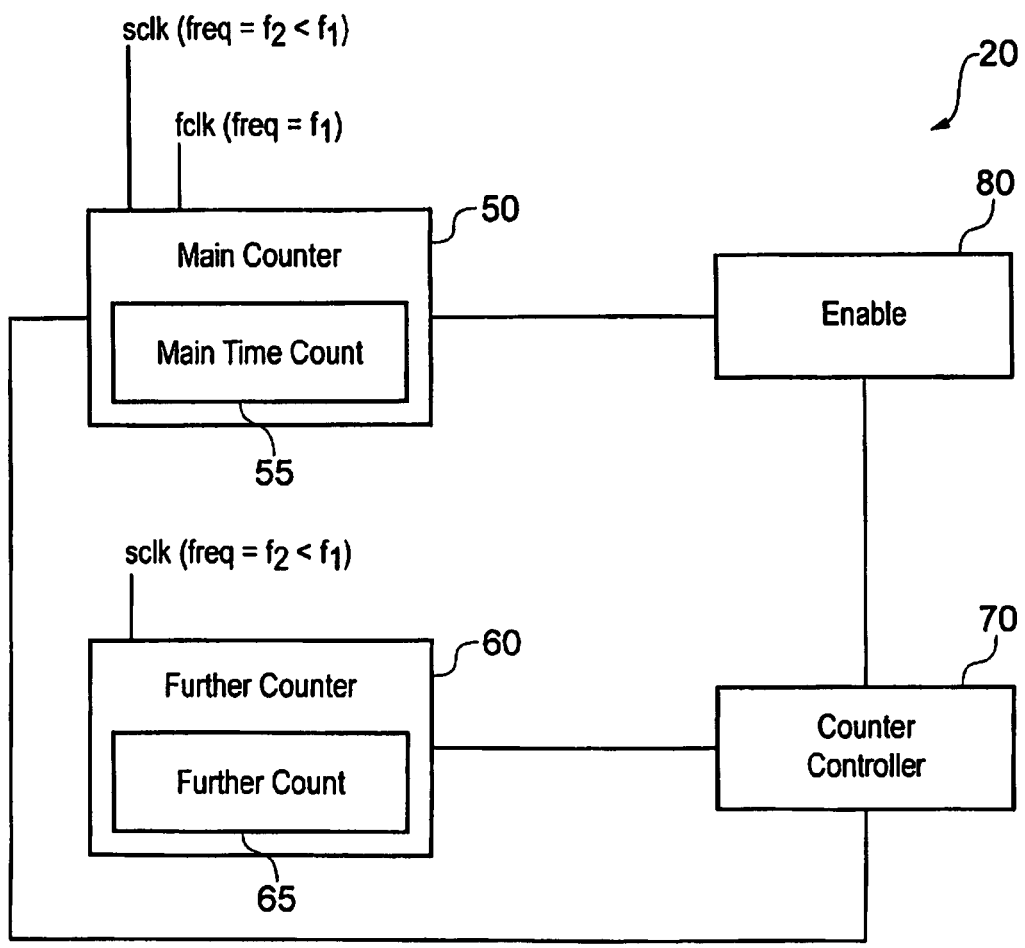
FIG. 2 illustrates the counting circuit.

FIG. 2 shows an example of the counter circuit 20. The counter circuit 20 composes a main counter 50 for maintaining the main time count value 55 indicating the amount of elapsed time. The main time count value 55 is the value which is passed to other circuit elements via the timer distribution bus 22 to enable those elements to keep track of time. During the normal mode, the main counter increments the time count value 55 in response to edges of the main clock signal fclk having a main clock frequency $f_1$. During the power saving mode, the main clock signal fclk is disabled, such that the main counter 50 stops incrementing the main time count value 55. The main counter 50 also receives the further clock signal sclk for controlling timings when switching between normal mode and power saving mode.

To allow the counter circuit 20 to keep time during the power saving mode, the counter circuit 20 also comprises a further counter 60 for maintaining a further count value 65. The further count value 65 is incremented in response to edges of the further clock signal sclk having a frequency $f_2$ which is less than the frequency $f_1$ of the main clock signal fclk.

The counter circuit 20 also includes a counter controller 70 for controlling the operation of the main counter 50 and further counter 60 and for controlling the reading and writing of the main and further time count values 55, 65. In FIG. 2, the counter controller 70 is illustrated as part of the counting circuit 20. In this embodiment, the main count value 55 is readable by the processors 8 within the system using a memory mapped access via memory interconnect 10. It is not essential for the further count value 65 to be accessible via a memory-mapped access.

However, in other embodiments the counter controller 70 may be provided outside the counter circuit 20. For example, the functions of counter controller 70 may be implemented using software executing on one of the processors 8 of the system-on-chip 2. In this case, both the main and further count values 55, 65 would be accessible to the processor 8 acting as the counter controller 70.

The counter circuit 20 also includes an enable flag 80. For example, the enable flag may comprise a single bit of a control register. When the enable flag 80 has a first state then the main counter 50 increments the main time count value 55, and when the enable flag 80 has a second state then the main counter 50 does not increment the main time count value 55. Hence, the enable flag 80 enables the incrementing of the main time counter 55 by the main counter 50 to be halted, for example to allow a debug operation or to implement a power saving mode.

It will be appreciated that the counting circuit 20 may have other elements not illustrated in FIG. 2. for example, the counter may have a status register storing an indication of the frequency with which the main counter is incremented.

Figure 3:
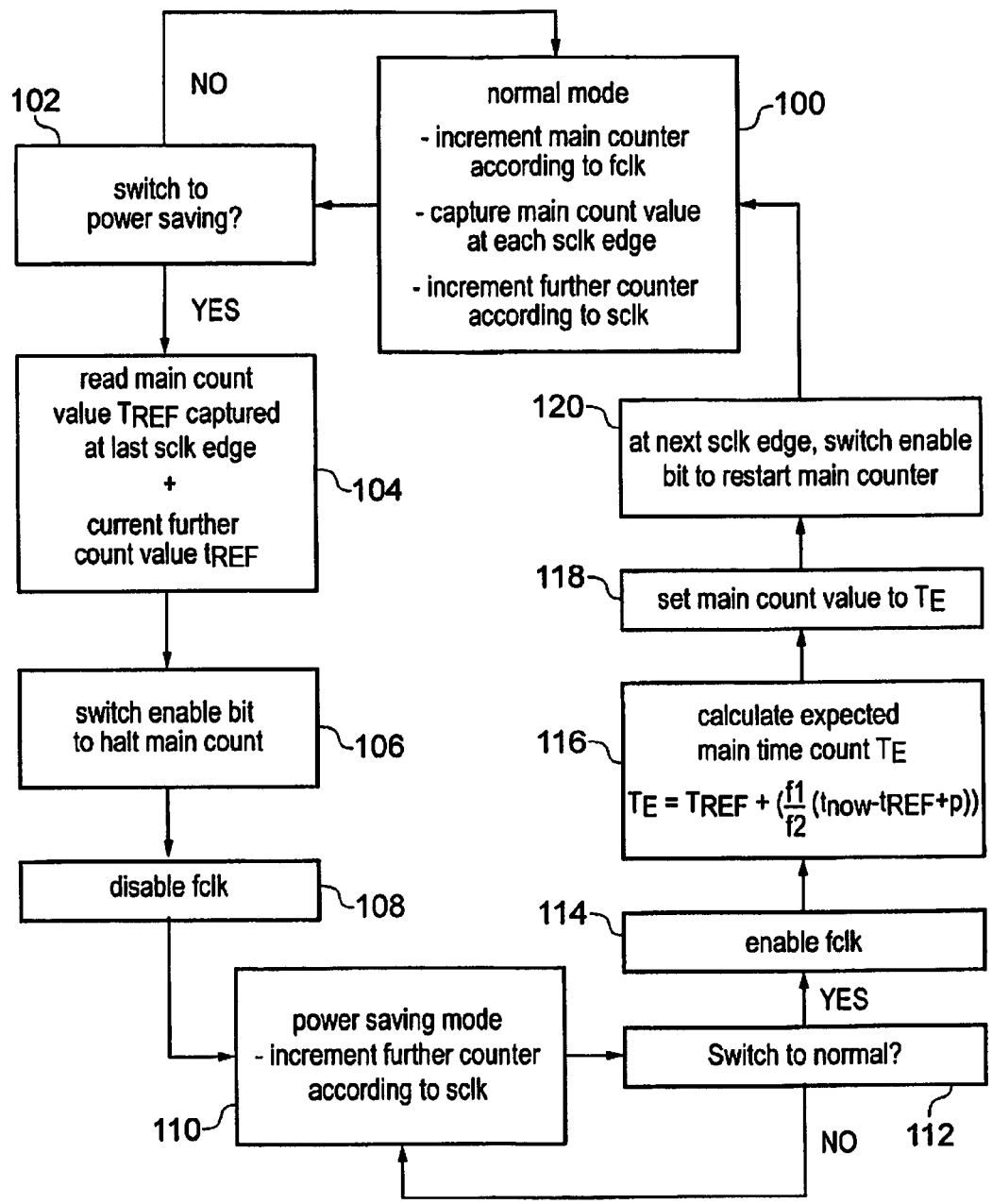
FIG. 3 illustrates a method of maintaining a time count value using the counting circuit.

FIG. 3 illustrates a technique for switching between the normal mode of operation and the power saving mode operation while maintaining the correct value of the main time count value 55. At step 100, the counter circuit 20 is operating in the normal mode of operation, in which the main counter 50 increments the time count value 55 in response to the main clock signal fclk. Meanwhile, the further counter 60 increments the further count value 65 according to the further clock sclk. Also, at each edge of the further clock signal sclk, the value of the main time count value 55 is captured and stored. As discussed below with respect to FIG. 6 and FIG. 7, a flip-flop within the main counter 50 can capture the main counter value at each further clock edge.

At step 102, the power controller 40 determines whether to switch the counter circuit 20 to the power saving mode. If so, then at step 104, the counter controller 70 reads the main count value $T_{REF}$ captured at the last further clock edge in step 100 and also reads the current value $t_{ref}$ of the further count value 65. At step 106, the counter controller 70 switches the enable bit 80 to halt incrementing of the main count value 55. At step 108, the power controller 40 controls the clock generator 42 to disable generation of the main clock signal fclk. At step 110 the counter circuit 20 operates in the power saving mode, in which the further counter 60 continues to increment the further count value 65 in response to edges of the clock signal sclk.

At step 112, the power controller 40 determines whether to switch the counter circuit 20 back to the normal mode for operation. If the circuit is to be switched to the normal mode then at step 114 generation of the main clock signal fclk is enabled by the clock generator 42. At step 116, the counter controller 70 calculates an expected main time count value $T_E$ according to the equation:

$$T_E = \left(\left(\frac{f_1}{f_2}\right)(n+p)\right) + T_{REF},$$

which will be explained below with respect to FIG. 4. The values $f_1$ and $f_2$ represent the frequencies of the main clock signal and further clock signal respectively. The value n represents the number of further clock edges counted by the further counter 60 during the power saving mode (i.e. the difference between the current value $t_{now}$ of the further count value 65 and the reference further count value $t_{REF}$ captured at step 104 of FIG. 3). The value $T_{REF}$ represents the captured reference time count value $T_{REF}$ which was read at step 104 of FIG. 3. The value p represents a prediction factor to account for the number of edges which elapse between calculation of the expected time count value and restarting of incrementing of the main counter 50.

At step 118, the counter controller 70 then sets the time count value 55 of the main counter to the expected time count value $T_E$ calculated at step 116. At the next edge of the further clock signal sclk at step 120, the counter controller 70 switches the state of the enable bit 80 to restart incrementing of the time count value 55 by the main counter 50. The circuit 20 now returns to the normal mode at step 100 of FIG. 3.

Figure 4:
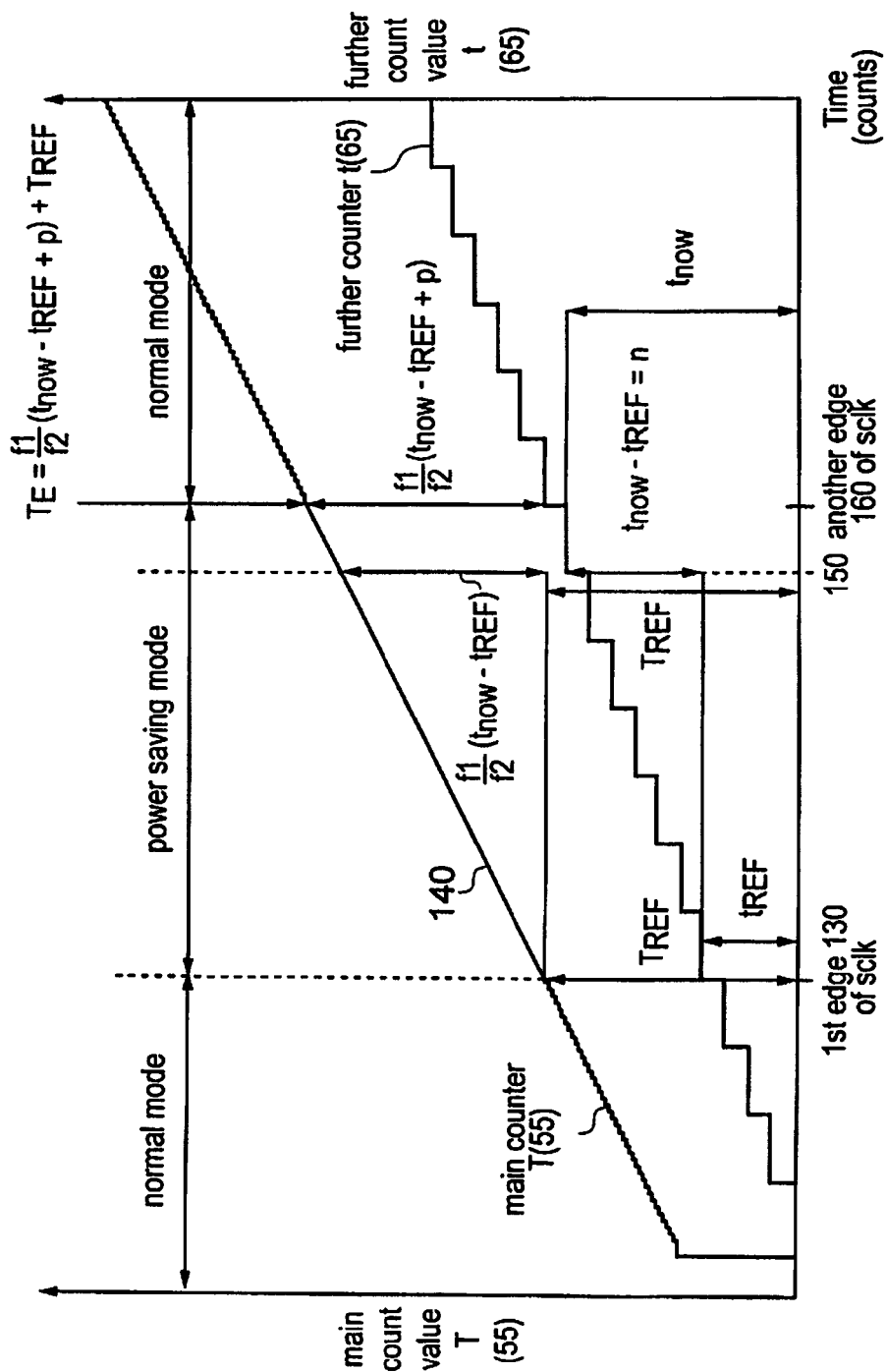
FIG. 4 illustrates an example of calculating an expected time count value for the main counter of the counting circuit.

FIG. 4 illustrates an example of the calculation of the expected time count value $T_E$. The graph of FIG. 4 plots the incrementing of the main counter 50 and the further counter 60 as the counter circuit 20 switches from the normal mode to the power saving mode and back to the normal mode again.

Initially, the counter circuit 20 is in the normal mode, in which the main counter 50 increments the time count value 55 according to edges of the main clock signal fclk and the further counter 60 increments the further count value 65 in response to edges of the further clock signal sclk. The main count value 55 is incremented more frequently than the further count value 65. At each edge of the further clock signal sclk, the current value of the main counter is captured by a storage element of the main counter (see FIGS. 6 and 7 below). Hence, when the circuit 20 is switched to the power saving mode shortly after a first edge of 130 of the further clock signal sclk, the value which the main count value 55 had at the first edge 130 is read from the storage element and stored as a reference value $T_{REF}$. Also, the current value of the further count value 65 is read and stored as a reference value $t_{REF}$.

The counter circuit 20 is then switched to the power saving mode in which the main clock signal is disabled so that the main counter 50 stops counting the time count value 55. Line 140 in FIG. 4 shows the way in which the main count value 55 would continue to increment if the counter circuit 20 remained in the normal mode during this period. Meanwhile, the further counter 60 continues to increment the further count value 65 in response to edges of further clock signal.

Later on, at an edge 150 of the further clock signal sclk, the counter circuit 20 is triggered to switch back to the normal mode. On switching to the normal mode, the current value $t_{now}$ of the further counter 60 is read. Hence, during the power saving mode, the number of elapsed edges of the further clock signal counted by the further count 60 since the first further clock edge 130 is $n=t_{now}-t_{REF}$.

If the main counter 50 had continued to increment the time count value 55 during the power saving mode, at further clock edge 150 the main count value 55 would have increased by $$\frac{f_1}{f_2}n,$$

where $f_1/f_2$ is the ratio between the frequency $f_1$ of the main clock signal fclk and the frequency $f_2$ of the further clock signal sclk. Therefore, the value of the main count value 55 at further clock edge 150 would be $$T_E\left(\left(\frac{f_1}{f_2}\right)n\right)+T_{REF}.$$

However, at the time of calculating the expected main time count value, the incrementing of the main counter will not be restarted yet. Some time is required to calculate the time count value and write the expected time count value to the main counter 50 before the main counter 50 can be restarted. To account for this time, a prediction factor of p is added to the counted number of elapsed edges n of the further clock signal, so that the expected time count value is calculated using the equation $$T_E\left(\left(\frac{f_1}{f_2}\right)(n+p)\right)+T_{REF},$$

where $n=t_{now}-t_{REF}$. In the example shown in FIG. 4, p has a value of one, since one cycle of the further clock signal elapses between calculating of the expected time count value at cycle 150 and restarting the main counter at time 160.

Hence, by calculating the expected main time count value in this way and timing both the capture of the reference value $T_{REF}$ and the restarting of the main counter to edges 130, 160 of the further clock signal sclk, an accurate estimate of the value of the main counter can be determined by the counter controller 70. Therefore, the correct value of the main counter can be maintained following exit from the power saving mode, even if the main clock signal and further clock signal are not synchronized and/or the ratio between the clock frequencies $f_1$ and $f_2$ is a non-integer ratio.

Figure 5:
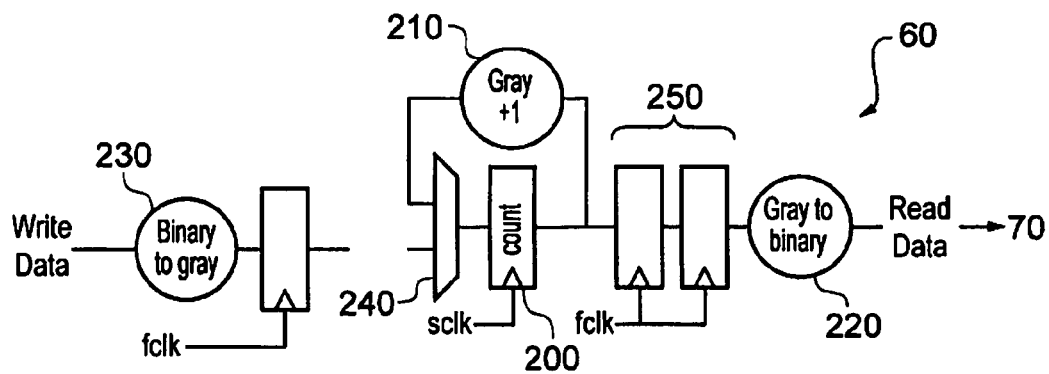
FIG. 5 illustrates an example of the further counter of the counting circuit.

FIG. 5 shows an example configuration of the further counter 60. The further counter 60 comprises a flip-flop 200 which stores the further count value 65.

The further count value 65 is Gray encoded so that consecutive values of the count value differ only in the state of a single bit. At each edge of the further clock sclk, a Gray adder 210 adds one to the further count value 65. A Gray-to-binary encoder 220 converts the counter value to a binary representation when the count value is read by the counter controller 70. Similarly, a binary-to-Gray encoder 230 converts a binary value to be written to the further counter 60 into the Gray encoding for writing to the flip-flop 200 via a multiplexer 240. A synchronizer 250 comprising back to back flip-flops clocked by the main clock signal fclk is provided between the flip-flop 200 and the output to the counter controller 70. The synchroniser 250 prevents metastability in the read counter value (which could otherwise arise from the fact that the flip-flop 200 is clocked by a slower clock signal sclk but read according to a faster clock signal fclk).

Figure 6:
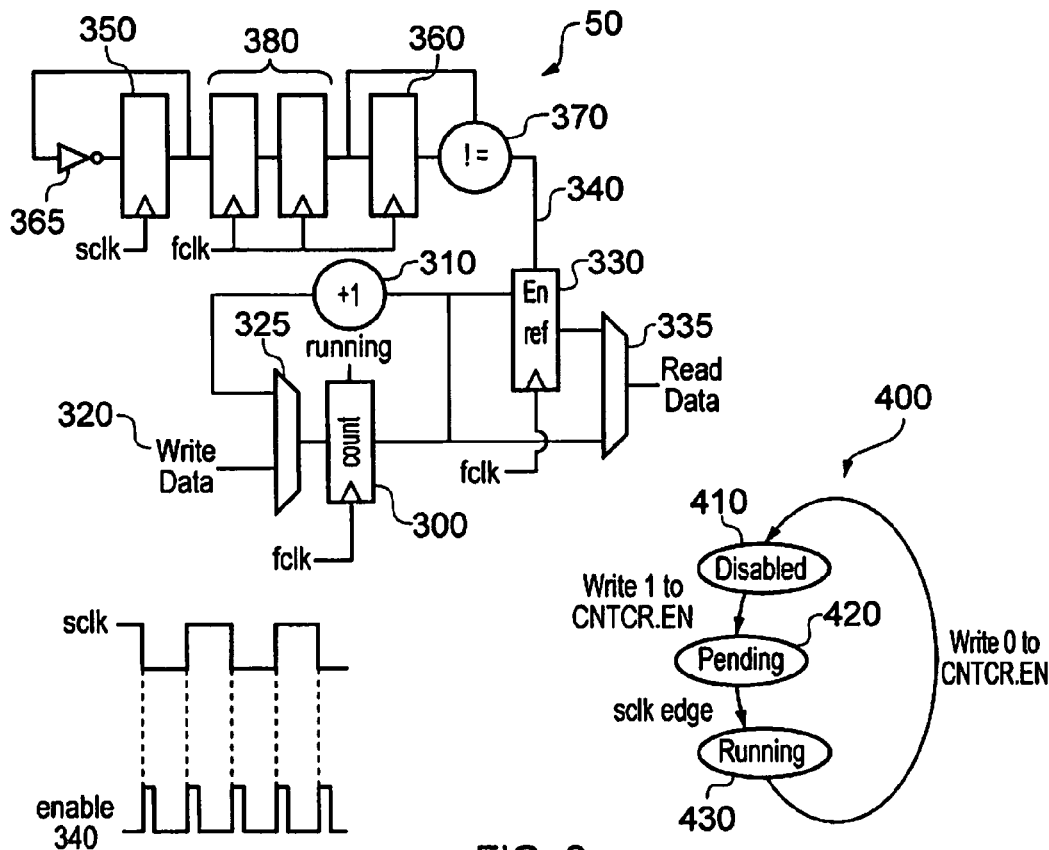
FIG. 6 shows a first example of the main counter of the counting circuit.

FIG. 6 shows an example arrangement of the main counter 50. A flip-flop 300 maintains the time count value 55 in a binary representation. During the normal mode, an incrementer 310 increments the value of the flip-flop 300 in response to each edge of the main clock signal sclk. A new value for the main counter 50 can also be written to the flip-flop 300 using write input 320 and multiplexer 325. During the normal mode of operation, the time count value in the main flip-flop 300 is provided to the timer distribution bus 22 (see FIG. 1) via the multiplexer 335.

A further flip-flop 330 is provided for capturing, as a reference value, the time count value of the main flip-flop 300 at each edge of the further clock signal sclk. The capturing flip-flop 330 receives as an enable signal a pulse signal 340 which is generated based on the further clock signal sclk to have a pulse at each edge of the further clock sclk (see the signal profiles shown in FIG. 6). At each pulse, the capturing flip-flop 330 captures the current value of the main counter 300 and retains that value until the next pulse of the enable signal 330. During the power saving mode (either on entry to the power saving mode or at some point before the expected time count value is to be calculated), the counter controller 70 reads the captured reference value ($T_{REF}$ in FIG. 4) from the flip-flop 330 via the multiplexer 335.

FIG. 6 also shows a state machine 400 for controlling updates to the enable bit 80. The state machine 400 may be implemented in hardware or software. While in the power saving mode the pulse signal 340 is generated using a pair of flip-flops 350, 360. an inverter 365 causes the flip-flop 350 generates an alternating sequence of high and low signal values switching in accordance with the slow clock signal sclk. The second flip-flop 360 is clocked in accordance with the faster main clock fclk and so captures the value output by the first flip-flop 350 at each edge of the main clock signal. A comparator 370 compares the value captured by the second flip-flop 360 in a previous main clock cycle with the value output by the first flip-flop 350 in the current main clock cycle and generates a pulse when the two values have different values, which will occur for one main clock cycle at each transition of the slow clock signal sclk. Hence, the comparator 370 generates the pulse signal 340 in which a pulse having a pulse width corresponding to the duration of a single main clock cycle is generated at each further clock transition. As in the further counter 60, a synchronizer 380 can be used in the main counter 50 to prevent metastability where the signal from the flip-flop 350, which is transitioning at the slower further clock frequency, is captured in response to the faster main clock signal by the flip-flop 360. While FIG. 6 shows a particular circuit for generating the pulse signal 340, it will be appreciated that other kinds of pulse generating circuits could also be used.

FIG. 6 also shows a state machine 400 for controlling updates to the enable bit 80. While in the power saving mode, the state machine 400 is initially in a disabled state 410 indicating that the main counter 50 is not incrementing the time count value 55. When a switch to the normal mode is desired, the counter controller 70 receives a request to write an updated value (e.g. 1) to the enable bit 80. The state machine 400 then enters a pending state 420 in which the write to the enable bit 80 has been requested but has not yet been carried out. The counter controller 70 then waits for an edge of the further clock signal sclk before switching to a running state 430 in which the write to the enable bit 80 is carried to allow the main counter 50 to resume counting. The main counter 50 then continues counting until the system enters the power saving mode once more and the state machine 400 returns to the disabled state 410 (e.g. when the enable bit has a value of 0). Hence, the state machine 400 enables the counter controller 70 to ensure that updates to the enable bit 80 occur only in response to an edge of the further clock signal sclk when the counting circuit is in the power saving mode.

Figure 7:
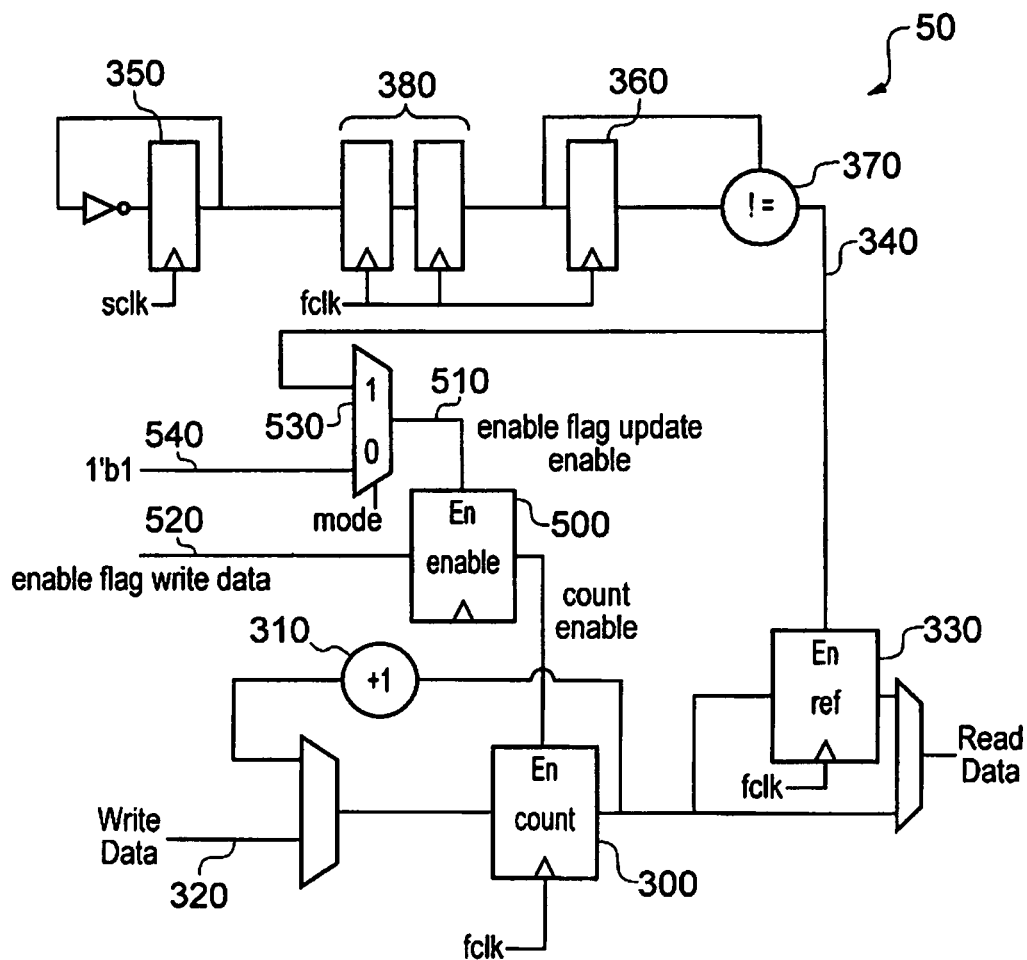
FIG. 7 shows a second example of the main counter of the counting circuit.

FIG. 7 shows another example arrangement of the main counter 50. Elements which are the same as in FIG. 6 are indicated with the same reference numerals. The enable bit is stored in a flip-flop 500 whose output is used as an enable signal for the main count flip-flop 300. The main counter 300 can only be incremented when the output of the enable flip-flop 500 has a predetermined state (e.g. a value of 1).

The enable flip-flop 500 itself receives an update enable signal 510 which controls whether or not the enable bit can be written in response to enable flag write data 520. If the update enable signal 510 has a first value (e.g. 1), then the enable flag can be written, while if the update enable signal 510 has a second value (e.g. 0) the enable flag cannot be written.

During the normal mode, a multiplexer 530 passes a fixed value (e.g. 1'b1) to the enable input of the enable flip-flop 500 to ensure that the enable bit can be written in response to the write data 520. However, during the power saving mode the multiplexer 530 supplies the pulse signal 340 to the enable input of the enable flip-flop 500. Pulse signal 340 is the same signal that controls capturing of the count value by the capturing flip-flop 330, so has a pulse at each edge of the further clock signal sclk (see FIG. 6). By providing the pulse signal 340 to the enable flag flip-flop 500, the enable flag can only be updated in response to an edge of the further clock signal sclk (at each pulse of the pulse signal 340). This ensures that the main counter flip-flop 300 can only restart incrementing the main count value 55 in response to a further clock signal edge, which as discussed above, allows for a more accurate determination of the expected time count value at the time at which the main counter is restarted.

FIG. 7 shows an example in which the capturing of the time count reference value on entry to power saving, and the restarting of incrementing of time count value on exit from the power saving mode, is controlled in hardware by circuitry of the counting circuit 20.

Figure 8:
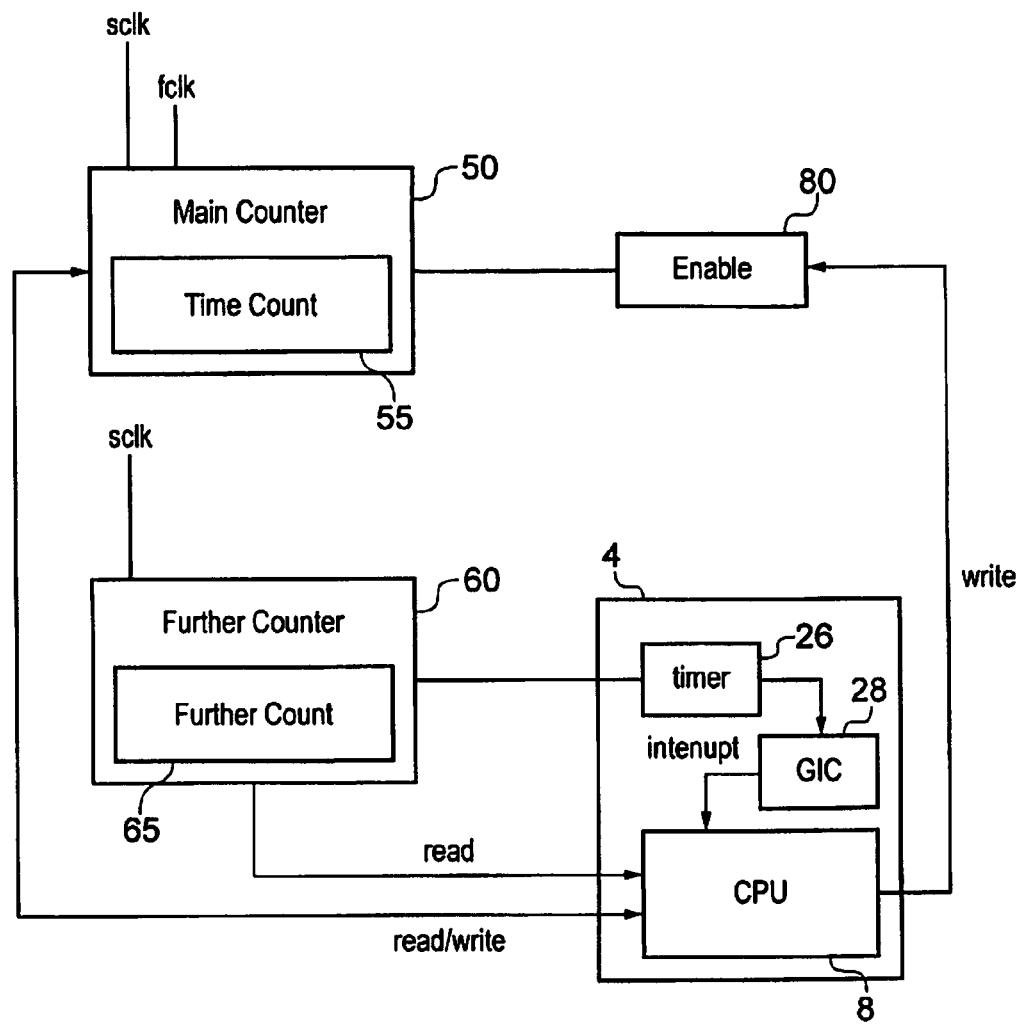
FIG. 8 illustrates an embodiment in which interrupts are generated to trigger the counter to switch between operating modes.

However, in the embodiment shown in FIG. 8 these events may be controlled in software by a processor 8 in response to interrupts. In the embodiment of FIG. 8, when a switch between the normal mode and the power saving mode is desired, a timer 26 can be set up to trigger the interrupt controller 28 to issue an interrupt to the processor 8 in response to an edge of the further clock signal sclk. For example, the timer 26 may monitor the further count value 65 maintained by the further counter 60 and trigger an interrupt when the further count value 65 reaches a certain value. In response to the interrupt, the processor 8 then performs the required state saving and restoring operations for the main counter and controls the writing of the enable bit 80.

Figure 9:
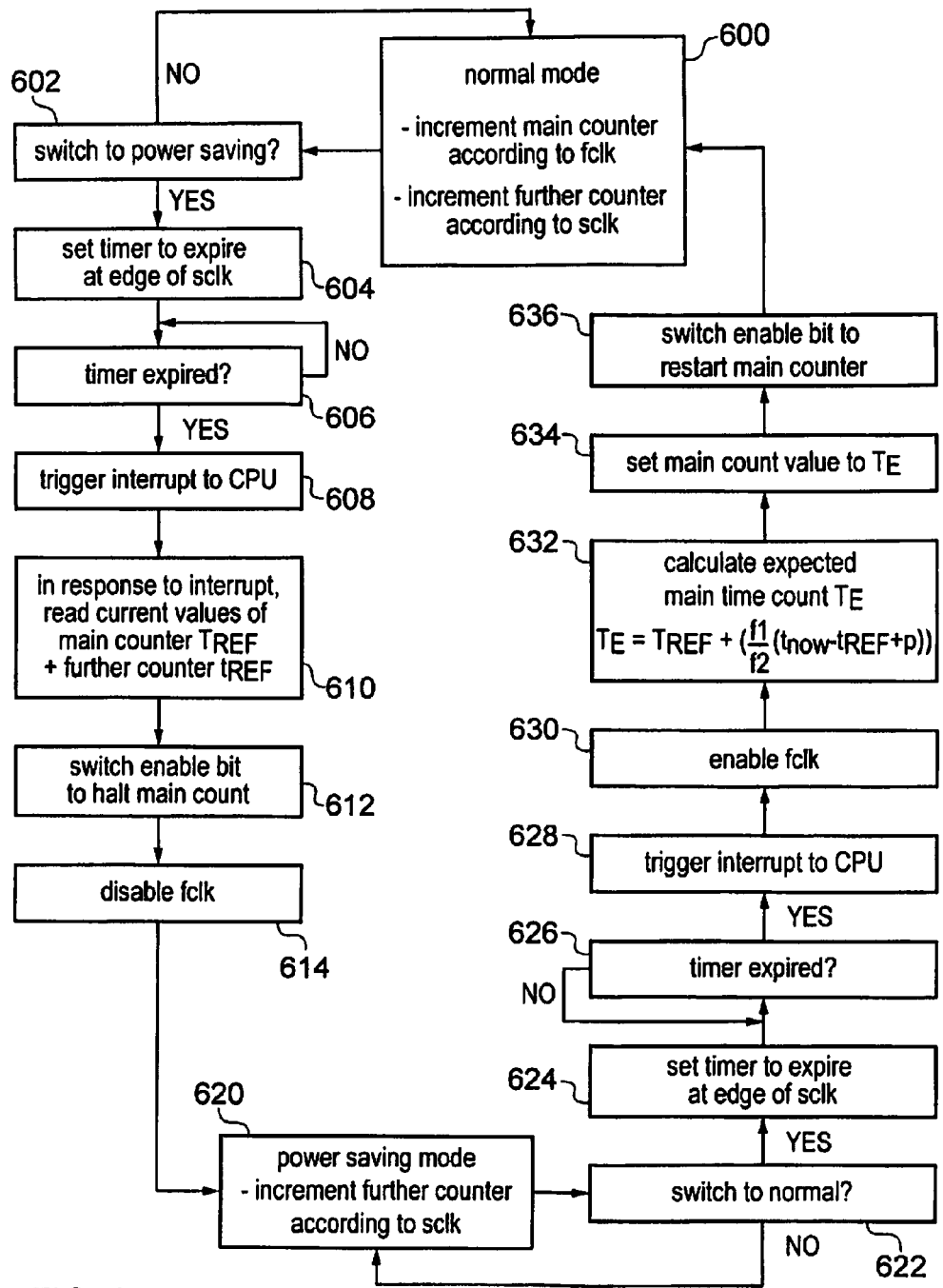
FIG. 9 illustrates a method of maintaining a time count value in the embodiment of FIG. 8.

FIG. 9 illustrates an example of the way in which the interrupts can be handled in the embodiment of FIG. 8. At step 600, the counting circuit operates in the normal mode, in which the main counter 50 increments the main count value 55 according to edges of the main clock fclk and the further counter 60 increments the further count value 65 according to the edges of the further clock signal sclk. At step 602, the power controller 40 determines whether to switch the counter circuit 20 to power saving mode. If so, then at step 604, the power controller 40 causes a timer 26 to be configured to expire at an edge of the further clock signal sclk. At step 606, it is determined whether the timer has expired. If so, then at step 608 an interrupt is generated by the interrupt controller 28 to trigger the processor 8 to read current values of the main count value 55 and further count value 65 at step 610 and store these values as reference values. At step 612, the processor 8 switches the enable bit 80 to halt incrementing of the main counter 50. The main clock signal fclk is disabled at step 614. The circuit now operates in the power saving mode at step 620, in which the main counter 50 is disabled and the further counter 60 increments the further count value 65 in response to edges of the further clock signal.

If a switch to the normal mode is desired at step 622, then at step 624 a timer 26 is configured to expire at another edge of the further clock signal sclk. When the timer expires at step 626, another interrupt is generated by the interrupt controller 28 at step 628. In response to the interrupt, the processor 8 controls the power controller 40 to enable generation of the main clock signal fclk at step 630. At step 632, the processor 8 calculates the expected main time count value $T_E$ in the way described above. At step 634, the processor 8 writes the expected time count value to the main counter 50. At step 636, the processor 8 switches the state of the enable bit 80 to restart incrementing of the main time count value 55 from the calculated expected time count value. The circuit then returns to normal mode in step 600.

It can be seen from FIG. 9 that, although the interrupts are triggered by an edge of the further clock signal sclk, the events which occur in response to the interrupt will occur with a slight delay after the edge of the further clock signal sclk. Provided that the interrupts are serviced with a reasonably deterministic delay such that the interrupt on entering the power saving mode and the interrupt on exiting the power saving mode are serviced in about the same time, the period between capturing the reference value at step 610 and restarting incrementing of the main counter except 636 will be the same as the interval between the edges of the further clock which triggered the interrupts at steps 608 and 628 and so an accurate expected time count value can be calculated.

In summary, by providing a further counter for counting elapsed edges of a further clock signal during a power saving mode in which a main counter is deactivated, and timing events on entering and exiting the power saving mode to edges of the further clock signal, an accurate estimation of the expected time count value of the main counter can be determined and on exiting the power saving mode the main count value can be restored to the value which it would have reached had the main counter continued counting main clock edges in the normal mode. This can be achieved irrespective of whether the main and further clock signals are synchronized or have integer frequency ratios. Hence, the present technique enables a wider choice of power saving states to be implemented in the counting circuit.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A data processing apparatus comprising:
a counting circuit for maintaining a time count value for said data processing apparatus, said counting circuit comprising a main counter and a further counter; and
a counter controller configured to control said counting circuit; wherein:
said counting circuit has a plurality of modes of operation including:
(i) a normal mode of operation in which said main counter is configured to increment said time count value in response to clock edges of a main clock signal; and
(ii) a power saving mode of operation in which said main clock signal is disabled, and said further counter is configured to count a number of elapsed clock edges of a further clock signal having a lower frequency than said main clock signal; wherein:
on switching from said normal mode to said power saving mode, at least one of said counting circuit and said counter controller is configured to store, as a reference time count value, a current value of said time count value at a timing triggered by a first edge of said further clock signal; and
on switching from said power saving mode to said normal mode, said counter controller is configured to set said time count value of said main counter to an expected time count value calculated based on said reference time count value and the number of elapsed clock edges of said further clock signal counted by said further counter since said timing triggered by said first edge, and to control said main counter to restart incrementing of said time count value from said expected time count value at a timing triggered by another edge of said further clock signal.

2. The data processing apparatus according to claim 1, wherein said counting circuit comprises said counter controller.

3. The data processing apparatus according to claim 1, comprising a processing circuit for performing data processing, said processing circuit acting as said counter controller.

4. The data processing apparatus according to claim 3, wherein:
on switching from said normal mode to said power saving mode, said processing circuit is configured to generate an interrupt in response to said first edge of said further clock signal and, in response to said interrupt, to capture said reference clock signal value; and
on switching from said power saving mode to said normal mode, said processing circuit is configured to generate another interrupt in response to said other edge of said further clock signal and, in response to said other interrupt, to set said time count value to said expected time count value and to control said main counter to restart incrementing of said time count value from said expected time count value.

5. The data processing apparatus according to claim 1, wherein said further counter is configured to increment a further count value in response to clock edges of said further clock signal during both said normal mode and said power saving mode.

6. The data processing apparatus according to claim 5, wherein:
on switching from said normal mode to said power saving mode, said counter controller is configured to store, as a reference further count value, a current value of said further count value at said timing triggered by said first edge; and
on switching from said power saving mode to said normal mode, said counter controller is configured to determine said number of elapsed clock edges of said further clock signal since said timing triggered by said first edge as a difference between said reference further count value and a current further count value of said further counter.

7. The data processing apparatus according to claim 5, wherein said further count value of said further counter is read by said counter controller under control of said main clock signal.

8. The data processing apparatus according to claim 5, wherein said further count value of said further counter is Gray encoded.

9. The data processing apparatus according to claim 1, wherein said counter controller is configured to calculate said expected time count value $T_E$ according to the equation $$T_E = \left(\left(\frac{f_1}{f_2}\right)(n+p)\right) + T_{REF},$$

wherein:
$f_1$ represents a frequency of said main clock signal;
$f_2$ represents a frequency of said further clock signal;
n represents said number of elapsed clock edges of said further clock signal counted by said further counter since said timing triggered by said first edge of said further clock signal;

$T_{REF}$ represents said reference time count value; and p represents a predicted number of further clock edges of said further clock signal which are predicted to elapse between the last of said counted number of elapsed clock edges and said main counter restarting incrementing of said time count value.

10. The data processing apparatus according to claim 9, wherein p=1.

11. The data processing apparatus according to claim 1, wherein said counting circuit is configured to store an enable flag for controlling whether said main counter increments said time count value;

on switching from said power saving mode to said normal mode, said enable flag is updated to restart said incrementing of said time count value by said main counter; and during said power saving mode said enable flag is updated only in response to an edge of said further clock signal.

12. The data processing apparatus according to claim 1, wherein said counting circuit comprises a storage element configured to capture a current value of said time count value of said main counter in response to each clock edge of said further clock signal.

13. The data processing apparatus according to claim 12, wherein on switching from said normal mode to said power saving mode, said counter controller is configured to read the captured value from said storage element and store said captured time count value as said reference time count value.

14. The data processing apparatus according to claim 12, wherein during said power saving mode said storage element is configured to maintain said captured time count value, and before calculating said expected time count value said counter controller is configured to read said captured time count value from said storage element.

15. The data processing apparatus according to claim 1, wherein said first edge of said further clock signal comprises the most recent edge of said further clock signal before switching to said power saving mode.

16. The data processing apparatus according to claim 1, wherein said other edge of said further clock signal comprises the next edge of said further clock signal after setting said time count value to said expected time count value.

17. The data processing apparatus according to claim 1, comprising a clock generator configured to generate said main clock signal and said further clock signal, and a power controller configured to disable generation of said main clock signal by said clock generator during said power saving mode.

18. The data processing apparatus according to claim 1, wherein said further clock signal has a frequency of 32 kHz.

19. The data processing apparatus according to claim 1, wherein said clock edges of said main clock signal and said clock edges of said further clock signal comprise only rising edges or only falling edges.

20. The data processing apparatus according to claim 1, wherein said clock edges of said main clock signal and said clock edges of said further clock signal comprise both rising edges and falling edges.

21. A data processing apparatus comprising:

counting means for maintaining a time count value for said data processing apparatus; and counter controlling means for controlling said counting means; wherein:

said counting means has a plurality of modes of operation including a normal mode of operation and a power saving mode of operation, said counting means comprising:

(i) main counting means for, in said normal mode, incrementing said time count value in response to clock edges of a main clock signal; and (ii) further counting means for, in said power saving mode in which said main clock signal is disabled, counting a number of elapsed clock edges of a further clock signal having a lower frequency than said main clock signal; wherein on switching from said normal mode to said power saving mode, at least one of said counting means and said counter controlling means is configured to store, as a reference time count value, a current value of said time count value at a timing triggered by a first edge of said further clock signal; and on switching from said power saving mode to said normal mode, said counter controlling means is configured to set said time count value of said main counting means to an expected time count value calculated based on said reference time count value and the number of elapsed clock edges of said further clock signal counted by said further counting means since said timing triggered by said first edge, and to control said main counting means to restart incrementing of said time count value from said expected time count value at a timing triggered by another edge of said further clock signal.

22. A method of maintaining a time count value for a data processing apparatus, comprising steps of:

in a normal mode of operation, incrementing said time count value in response to clock edges of a main clock signal;

on switching from said normal mode to a power saving mode of operation, storing, as a reference time count value, a current value of said time count value at a timing triggered by a first edge of a further clock signal having a lower clock frequency than said main clock signal;

in said power saving mode, disabling said main clock signal and counting a number of elapsed edges of said further clock signal; and on switching from said power saving mode to said normal mode, setting said time count value to an expected time count value calculated based on said reference time count value and the number of elapsed edges of said further clock signal counted since said timing triggered by said first edge, and restarting incrementing of said time count value from said expected time count value at a timing triggered by another edge of said further clock signal.

* * * * *